(12) United States Patent
Sahoda et al.

(10) Patent No.: US 6,413,392 B1
(45) Date of Patent: Jul. 2, 2002

(54) SPUTTERING DEVICE

(75) Inventors: Tsuyoshi Sahoda; Toshimitsu Uehigashi; Yasushi Higuchi, all of Sanbu-gun; Kuniaki Nakajima; Tomoyasu Kondo, both of Susono, all of (JP)

(73) Assignee: Nihon Shinku Gijutsu Kabushiki Kaisha, Kanagawa (JP)

( * ) Notice: Subject to any disclaimer, the term of this patent is extended or adjusted under 35 U.S.C. 154(b) by 0 days.

(21) Appl. No.: 09/599,531

(22) Filed: Jun. 23, 2000

(30) Foreign Application Priority Data

Jun. 24, 1999 (JP) .......................... 11-177810
Jun. 16, 2000 (JP) ........................ 2000-181672

(51) Int. Cl.[7] .............................................. C23C 14/35
(52) U.S. Cl. ........................... 204/298.18; 204/298.06; 204/298.11; 204/298.12; 204/298.14; 204/298.17
(58) Field of Search ................... 204/298.06, 298.11, 204/298.2, 298.14, 298.17, 298.18, 298.19

(56) References Cited

U.S. PATENT DOCUMENTS

| | | | |
|---|---|---|---|
| 4,100,055 A | | 7/1978 | Rainey ................... 204/298.12 |
| 4,278,528 A | * | 7/1981 | Kuehnle et al. ....... 204/298.11 |
| 4,313,815 A | | 2/1982 | Graves, Jr. et al. ..... 204/298.26 |
| 4,747,926 A | * | 5/1988 | Shimizu et al. ........ 204/192.12 |
| 5,334,302 A | * | 8/1994 | Kubo et al. ............ 204/298.18 |
| 6,042,706 A | * | 3/2000 | Fu ......................... 204/192.12 |
| 6,066,242 A | * | 5/2000 | Glocker ................. 204/298.18 |
| 6,096,180 A | * | 8/2000 | Sichmann .............. 204/298.18 |

FOREIGN PATENT DOCUMENTS

| | | | | |
|---|---|---|---|---|
| JP | 63-255368 | * | 10/1988 | ............ 204/298.11 |
| WO | WO 97/39161 | * | 10/1997 | |

* cited by examiner

Primary Examiner—Rodney G. McDonald
(74) Attorney, Agent, or Firm—Armstrong, Westerman & Hattori, LLP (57) ABSTRACT

A sputtering device that efficiently guides sputtering particles ejected from a target to a film deposition subject and prolongs the interval at which a stick preventive member requires replacement. The sputtering device 1 has a vacuum chamber in which a specified sputtering target is placed so as to face a substrate 4 that is also placed in the vacuum chamber 2, and deposits a film on a surface of the substrate 4 using sputtering particles 20 ejected from the sputtering target 6; and particle ejection sections 60 constructed so as to slope at a specified angle of 30° to 60° with respect to the surface of the substrate 4, and respectively facing each other in the shape of a funnel are provided on the sputtering target 6. Lines of magnetic force 13 run from an N pole of a magnet 7a arranged at a rear surface of the target 6 to an S pole of a magnet 7b arranged around the target 6.

14 Claims, 10 Drawing Sheets

SPUTTERING DEVICE

BACKGROUND OF THE INVENTION

1. Technical Field

The present invention relates to a sputtering device for manufacturing, for example, semiconductor devices or liquid crystal panels, and particularly to a sputtering device that uses a small target.

2. Related Art

Sputtering is the ejection of sputtering particles from a sputtering target (hereinafter referred to as a target) by causing, for example, argon gas ions generated by glow discharge to collide with the target.

Figure 12:
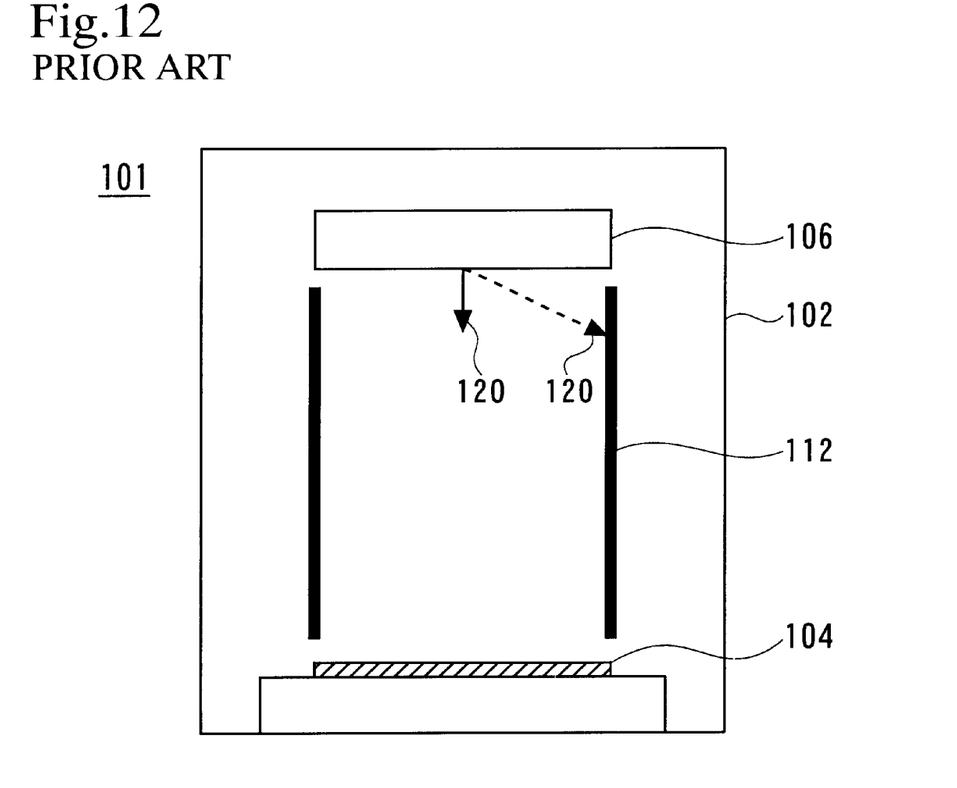
FIG. 12 is an explanatory drawing showing the essential structure of a sputtering device of the related art.

Conventionally, with this type of sputtering device 101, as shown for example in FIG. 12, a target 106 is located on an upper part of a vacuum chamber 102, sputtering particles ejected from this target 106 are deposited on a substrate 104 provided at a lower part of the vacuum chamber 102.

Figure 13:
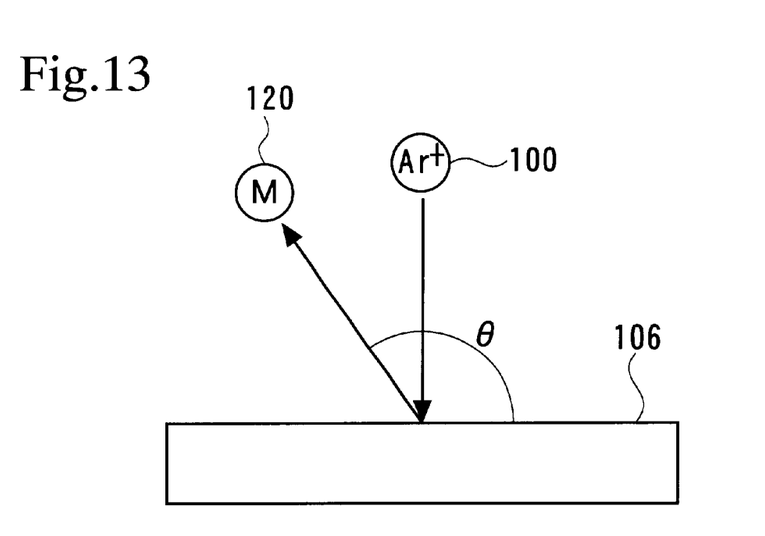
FIG. 13 is an explanatory drawing showing a relationship between argon gas ion injection angle and sputtering particle ejection angle.

However, with sputtering, as shown in FIG. 13, when argon gas ions 100 are injected vertically into a target 106, sputtering particles 120 can be considered to be ejected from the surface of the target 106 with a fixed angular distribution.

Figure 14:
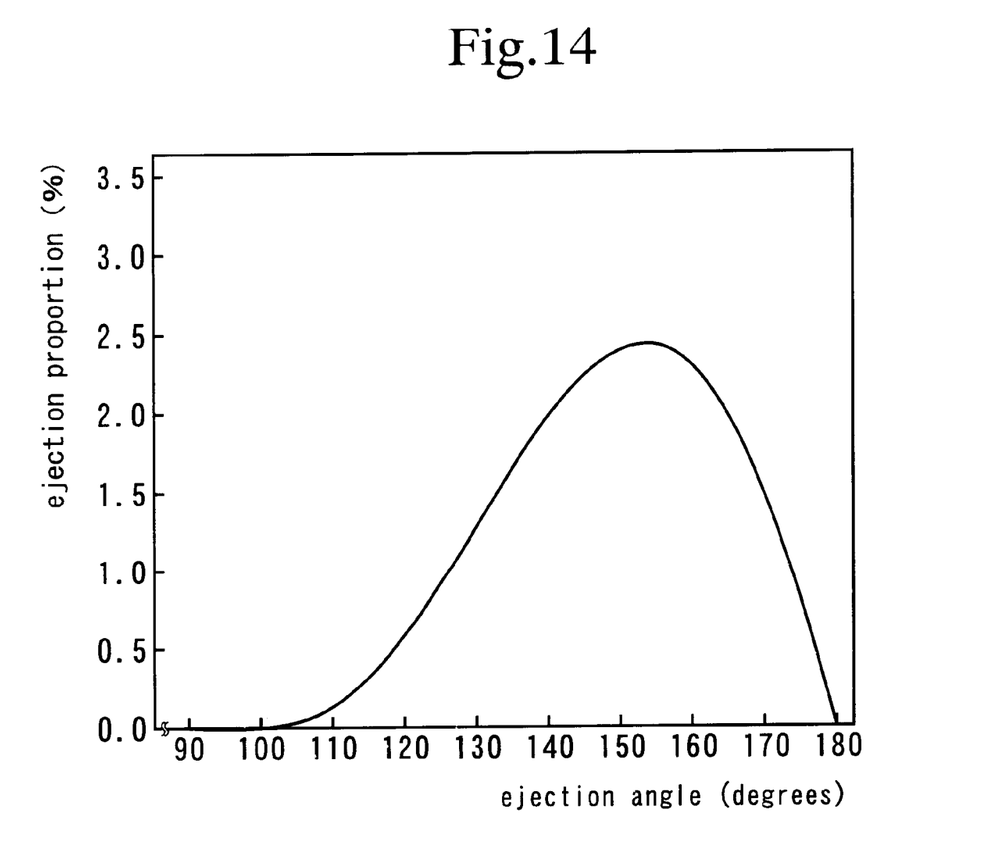
FIG. 14 is a graph showing simulation results for sputtering particle ejection angle.

When, for example, the target is copper, as shown in FIG. 14, the sputtering particles 120 are ejected in various directions with a peak angle close to approximately 150° with respect to the surface of the target 106.

As a result, with the conventional sputtering device 101 only some of the sputtering particles ejected from the target 106 reach the substrate and there is a problem whereby film deposition efficiency becomes unacceptable.

Also, as shown in FIG. 12, with respect to the conventional sputtering device 101, a stick preventive member 112 is provided to prevent deposition of sputtering particles to the inside of the vacuum chamber 102. However since, as described above, the direction in which the sputtering particles 120 are mainly ejected is towards the stick preventive member 112, the majority of sputtering particles 120 ejected from the target 106 become deposited to the stick preventive member 112 and as a result, there is a problem whereby the stick preventive member 112 has to be replaced frequently.

SUMMARY OF THE INVENTION

The present invention has been conceived in view of the above described drawbacks in the related art, and an object of the present invention is to provide a sputtering device that efficiently guides sputtering particles ejected from a target to a substrate and prolongs the interval at which a stick preventive member requires replacement.

In order to achieve the above described object, the resent invention provides a sputtering device, having a vacuum chamber in which a specified sputtering target is placed with a substrate so as to face, for depositing a film on a surface of the substrate using sputtering particles ejected from the sputtering target, provided with particle ejection sections constructed so as to slope at a specified angle with respect to the surface of the substrate, and respectively facing each other.

According to the present invention, the particle ejection sections of a target are arranged at a specified angle θ with respect to the surface of the substrate, which means that a lot of the sputtering particles ejected from the target are caused is to fly towards the substrate, and it is possible to make it difficult for particles to reach a stick preventive member.

Since the particle ejection surfaces are constructed facing each other, some of the sputtering particles ejected from the target become redeposited to the ejection sections of the target, which means that it is possible prolong the lifespan of the target by reducing the extent to which the target is eroded away.

The present invention enhances this effect by providing a sputtering device as described above, and by also having a first magnet arranged at the location of a rear surface side of the target, and a second magnet arranged surrounding the target.

According to the present invention, even more of the sputtering particles ejected from the target are caused to fly towards the substrate, and it is possible to make it difficult for particles to reach the stick preventive member.

According to the present invention, the object of the invention, is even more effectively achieved by having a slope angle θ of particle ejection sections of the target with respect to a normal line of the substrate of 30°–60°.

According to the present invention, the sputtering device has a plurality of targets arranged next to each other, with the targets being capable of a rotation relative to a substrate.

According to the present invention, in a multi-cathode type sputtering device having a plurality of small targets, it is possible to significantly prolong the lifespan of each target.

The present invention has a shield plate with holes corresponding to the target or targets arranged between the target and the substrate.

According to the fifth aspect of the invention, since it is possible to allow injection of only sputtering particles having a small injection angle into the substrate, it is possible to deposit a thin film in microscopic holes and microscopic grooves having high aspect ratio.

According to the present invention, since sputtering particles that are deposited to the shield plate do not drop down, it is possible to prevent the generation of particulate that will cause sputtering particles to be deposited to the inside of the vacuum chamber.

DESCRIPTION OF PREFERRED EMBODIMENTS

Embodiments of a sputtering device of the present invention will now be described in detail in the following, detailed description of the preferred embodiments with reference to the drawings.

Figure 1:
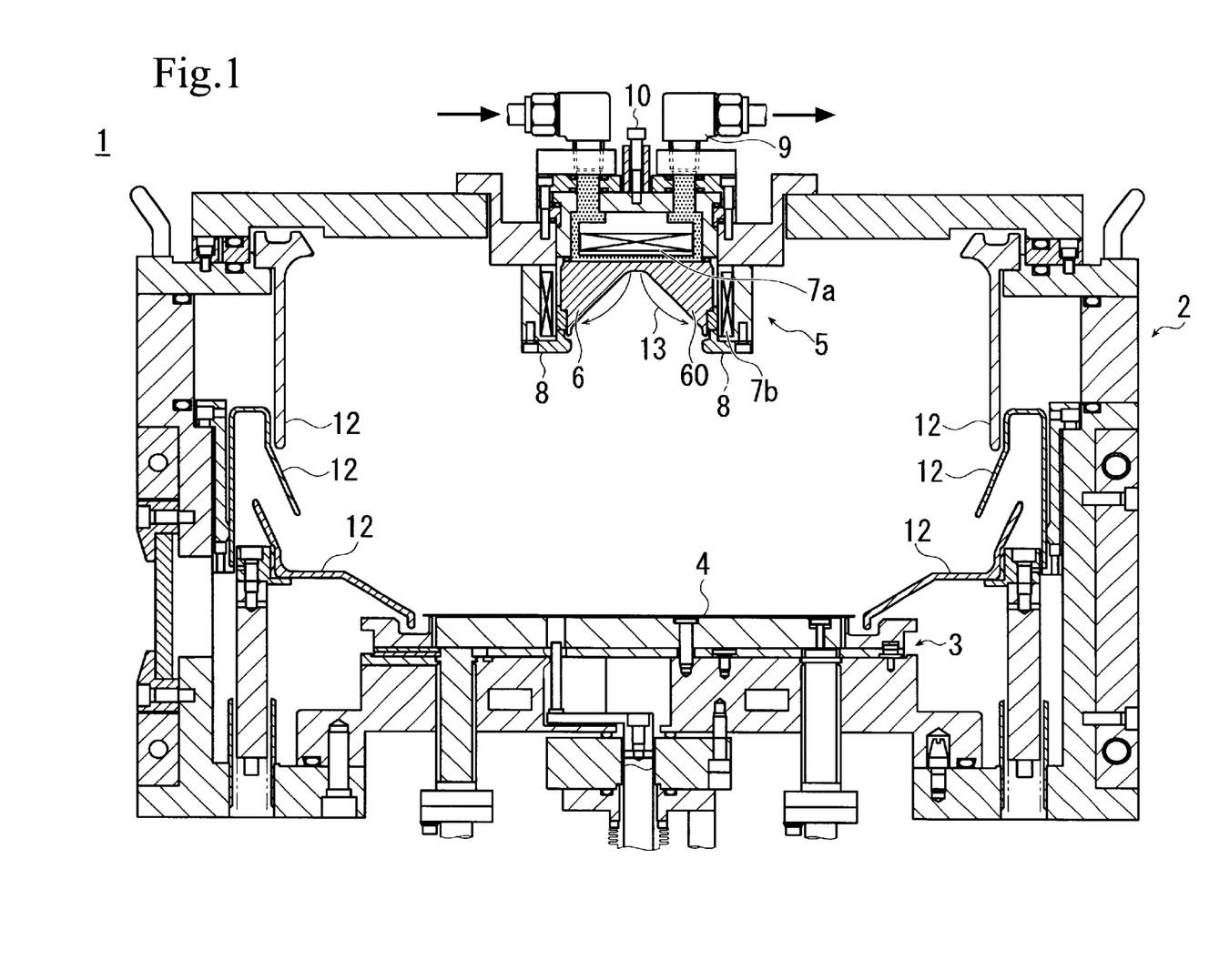
FIG. 1 is a cross sectional drawing showing the overall construction of one embodiment of a sputtering device of the present invention.

FIG. 1 is a cross sectional drawing showing the overall construction of one embodiment of a sputtering device of the present invention.

The sputtering device 1 of this embodiment is a magnetron sputtering device 1 provided with a single cathode electrode 10, and as shown in FIG. 1, has a vacuum chamber 2 connected to a vacuum exhaust system (not shown). A susceptor 3 is provided at a lower section inside the vacuum chamber 2, and a substrate 4, such as a silicon substrate, being the substrate, is mounted on the susceptor 3.

On the other hand, a target holder 5 is provided at an upper section inside the vacuum chamber 2, a target 6 deposited of metal such as copper and shaped as will be described later is held by the target holder 5.

In this embodiment of the present invention, a single cathode electrode 10 is arranged above a central section of the substrate 4 mounted on the susceptor 3, and a high voltage of 250–500 V is applied to the cathode electrode 10.

With this embodiment, first and second magnets 7a and 7b used to generate a magnetic field are arranged around and to the rear surface side of the target 6. The magnet 7b around the target 6 is built into the target holder 5.

An anode electrode 8 connected to ground is also attached to the bottom of the target holder 5.

A cooling water flow path 9 is provided above the target 6, and water is circulated within this cooling water flow path to cool the target 6.

A stick preventive member 12 for preventing sputtering particles depositing to the inside of the vacuum chamber 2 is provided between the substrate 4 and the target 6.

Figure 2A:
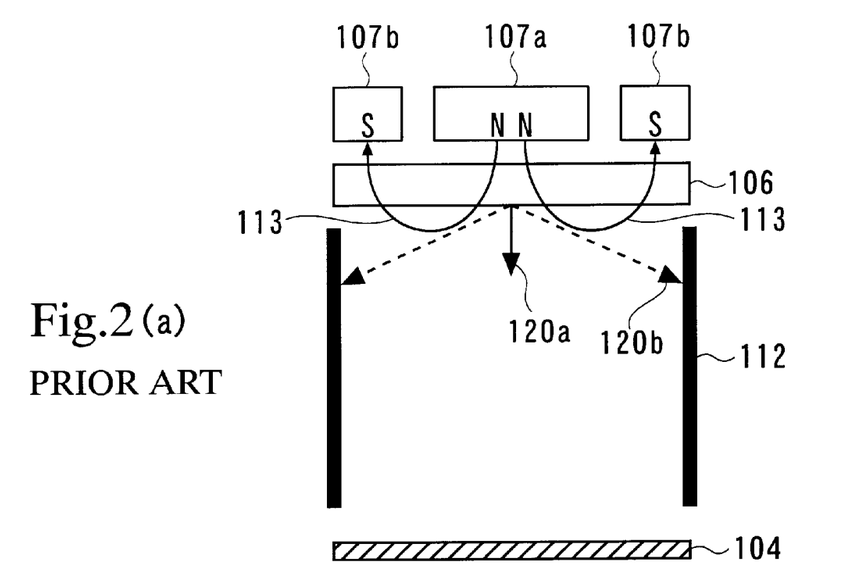
FIG. 2(a) is an explanatory drawing showing an essential construction of a magnetron sputtering device of the related art.
Figure 2B:
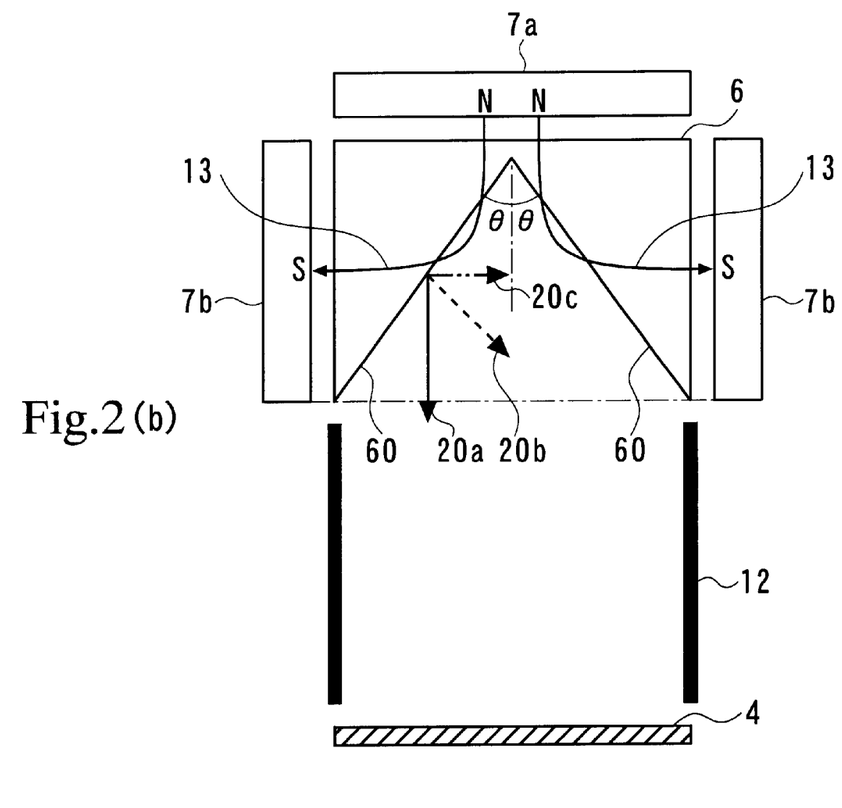
FIG. 2(b) is an explanatory drawing showing an essential construction of a magnetron sputtering device of an example of the present invention.

FIG. 2(a) and FIG. 2(b) are explanatory drawings to illustrate the principle of the present invention. Specifically, FIG. 2(a) shows the essential construction of a magnetron sputtering device of the related art, while FIG. 2(b) shows the essential construction of a magnetron sputtering device of the present invention.

As shown in FIG. 2(a), a magnetron sputtering device 101 of the related art is constructed so that lines of a magnetic force 113 coming out from the N poles of a magnet 107a arranged at a rear surface side of the target 106 pass through the target 106 and then return to the rear surface side of the target 106 to finally reach the S poles of the magnet 107b arranged next to the magnet 107a.

Consequently, in the magnetron sputtering device 101 of the related art, if it is assumed that sputtering particles 120 ejected from the surface of the target 106 due to collision of argon gas are ejected with the angular distribution shown in FIG. 14 mentioned above, then most of these particles 120b will fly towards the stick preventive member 112 and hardly any particles 120a will go towards the substrate 4.

The present invention is constructed so that particle ejection surfaces 60 of the target 6 facing the substrate 4 (susceptor 3) are constructed facing each other in the shape of the inside of a funnel, and lines of magnetic force 13 coming out from the N poles of the magnet 7a arranged on the rear surface side of the target 6 reach the S poles of the magnet 7b arranged around the target 6. Also, the particle ejection surfaces 60 of the target 6, in the shape of the inside of a funnel, is unitary.

Specifically, with the present invention, the particle ejection surfaces 60 of the target 6 are arranged at a specified angle θ with respect to a normal line N of the substrate 4, and consequently, as will be described later, some of the sputtering particles 20a of the sputtering particles 20 ejected from the target 6 are made to fly towards the substrate 4, and it can be made difficult for sputtering particles 20 to reach the stick preventive member 12.

The particle ejection surfaces 60 in the present invention are constructed facing each other, which means that some particles 20c of the sputtering particles 20 ejected from the target 6 become redeposited to the particle ejection surfaces 60 of the target 6, and as will be described later, it is possible to prolong the lifespan of the target 6.

Figure 3:
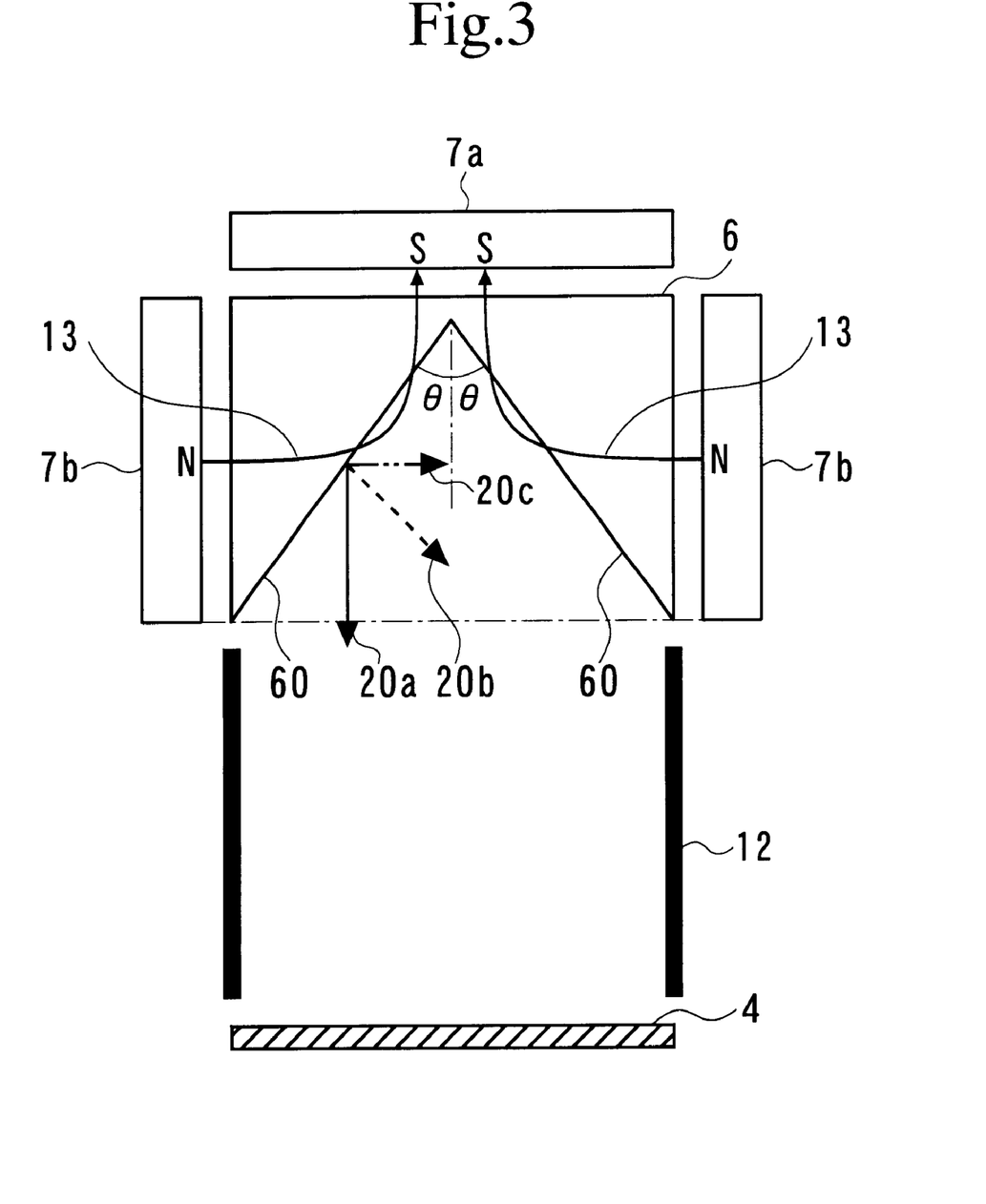
FIG. 3 is an explanatory drawing showing an essential construction of a magnetron sputtering device of the other example of the present invention.

FIG. 3 shows the other example of the essential construction of a magnetron sputtering device of the present invention. As shown in FIG. 3, lines of magnetic force 13 coming out from the N poles of the magnet 7b arranged around the target 6 reach the S poles of the magnet 7a arranged on the rear surface side of the target 6, in this example.

According to the present example having the structure as shown in FIG. 3, some of the sputtering particles 20a of the sputtering particles 20 ejected from the target 6 are made to fly towards the substrate 4, and it can be made difficult for sputtering particles 20 to reach the stick preventive member 12 as mentioned above.

Furthermore, some particles 20c of the sputtering particles 20 ejected from the target 6 become redeposited to the particle ejection surfaces 60 of the target 6, and it is possible to prolong the lifespan of the target 6.

Figure 4:
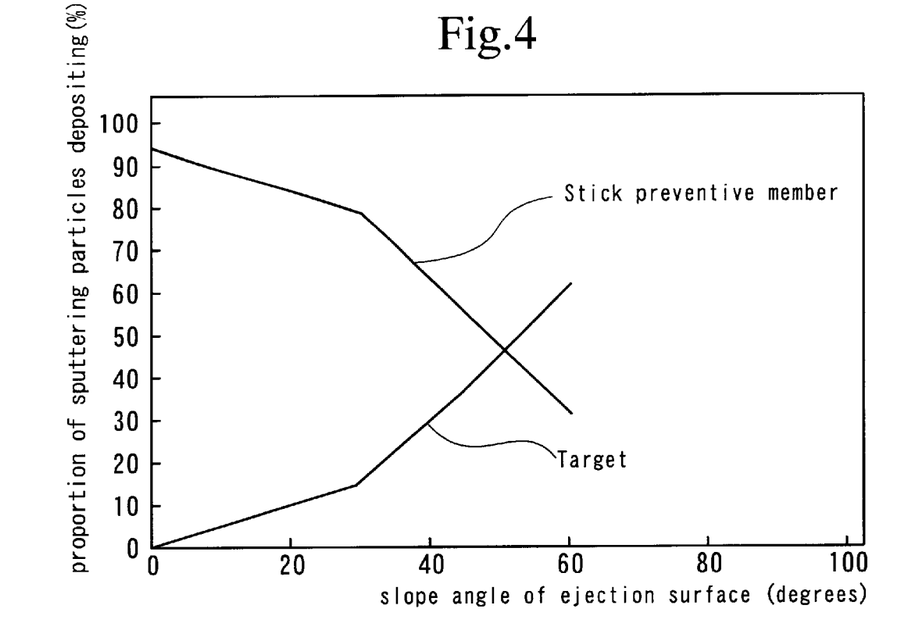
FIG. 4 is a graph showing simulation results for the proportion of sputtering particles deposited to the target and the stick preventive member with variation in angle of the particle ejection surface of the target.
Figure 5:
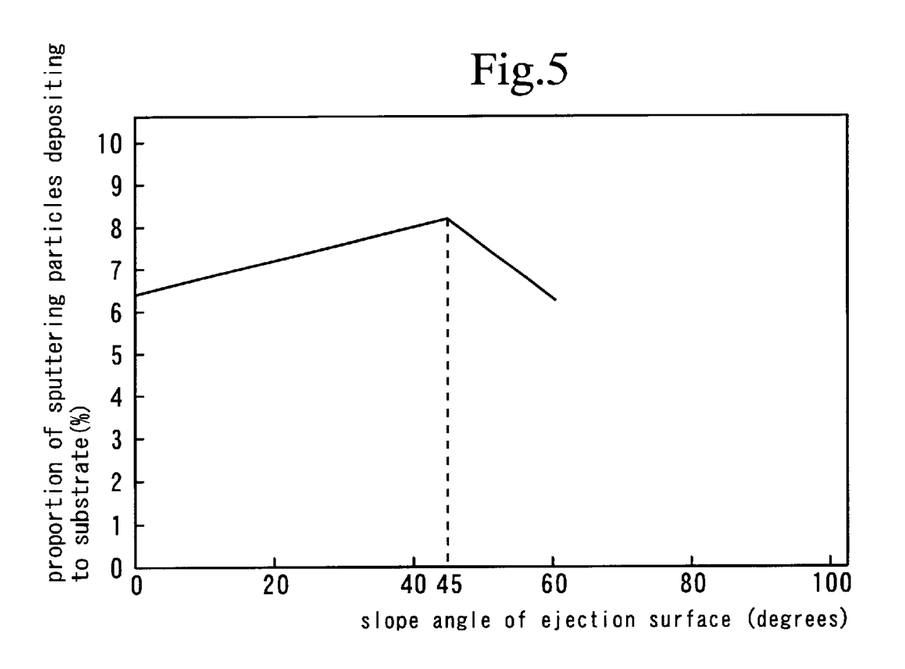
FIG. 5 is a graph showing simulation results for proportion of sputtering particles deposited to a substrate with variation in angle of the particle ejection surface of the target.

FIG. 4 is a graph showing simulation results for the proportion of sputtering particles depositing to the target and the stick preventive member with variation in angle of the particle ejection surface of the target, and FIG. 5 is a graph showing simulation results for the proportion of sputtering particles depositing to a substrate with variation in angle of the particle ejection surface of the target.

Here, simulation was carried out with the number of sputtering particles 20 ejected from the target 6 being kept constant, and the angle of the particle ejection surfaces 60 of the target 6 to 0°, 30°, 45° and 60° being varied.

As shown in FIG. 4, it will be understood that with the increase in the slope angle of the particle ejection surfaces 60 of the target 6 on the one hand, there is a reduction in sputtering particles 20b depositing to the stick preventive member 12, and on the other hand, there is an increase in the sputtering particles 20c depositing to the particle ejection surfaces 60 of the target 6. This trend intensifies with increase in slope angle of the particle ejection surfaces 60 of the target 6, which means that as the slope angle increases more sputtering particles deposit to the target 6 than to the stick preventive member 12.

On the other hand, as shown in FIG. 5, the proportion of sputtering particles 20a depositing to the substrate 4 becomes maximum when the slope angle θ of the particle ejection surfaces 60 of the target 6 is 45°. This means that in order to maximize the film deposition rate on the substrate 4 it is preferable to make the slope angle θ of the particle ejection surfaces 60 of the target 6 to be 45°.

Also, as shown in FIG. 4, in order to make the amount of sputtering particle depositing to the stick preventive member 12 extremely small, it is preferable to make the slope angle θ of the particle ejection surfaces 60 of the target 6 large. For example, of the case where the slope angle θ of the particle ejection surfaces 60 of the target 6 is 0° and the case where the slope angle θ of the particle ejection surfaces 60 of the target 6 is 45° are compared, the amount of sputtering particles 20 depositing to the stick preventive member 12 when the slope angle is 45° is approximately half compared to when the slope angle is 0°, which means that the lifespan of the stick preventive member can be almost doubled.

Figure 6:
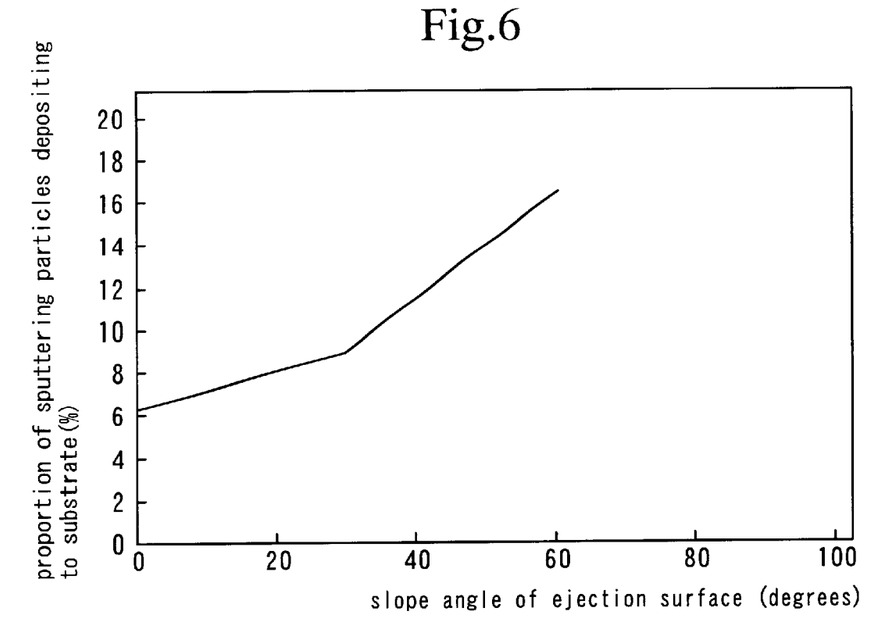
FIG. 6 is a graph showing simulation results taking into account re-sputter effect from the target.

FIG. 6 is a graph showing simulation results taking into account re-sputter effect (the effect where sputtering particles 20c are redeposited to the target 6) of the target 6 in the above simulation.

As described above, in this embodiment, because sputtering particles 20c that have been ejected from the particle ejection surfaces 60 of the target 6 deposited to the particle ejection surfaces 60 of the target 6, are it is possible to use the deposited sputtering particles 20c again as a target 6, thus making it possible to prolong the lifespan of the target 6.

Specifically, as shown in FIG. 6, compared to the case of a horizontal plate type target 6 of the related art (θ=0°) where only 6% sputtering particles of the mass of the target 6 is deposited to the substrate 4, in the case of the target 6 of the embodiment (θ=45°) at least 12% sputtering particles of the mass of the target 6 are deposited to the substrate 4. This means that the lifespan of the target 6 is twice that of the related art.

Taking the above results into consideration, the slope angle θ of the particle ejection surfaces 60 of the target 6 is preferably between 30°–60°, and the slope angle of the particle ejection surface 60 for most effectively forming a film of sputter particles 20a from the target 6 on the substrate 4 is 45°.

The embodiment of the sputtering device of the present invention will now be described in detail, in reference to a comparative example as follows.

Sputtering was carried out using the magnetron sputtering device 1 shown in FIG. 1. In this case, the target was made of titanium (Ti) and was provided with funnel shaped particle ejection surfaces having a slope angle of 45°.

With respect to target erosion, magnets are arranged around the target and at the rear surface so as to form a circle of 35 mm diameter concentrically around the target.

On the other hand, a magnetron sputtering device having a horizontal plate type target with a diameter of 70 mm, and a magnet arranged at a rear surface of the target so as to form a 35 mm diameter circle concentrically around the target were used in the comparative example.

Films were deposited by a device of the embodiment and a device of the comparative example using the same input power and the same film deposition duration, with film deposition rates for directly below the target being shown in FIG. 7.

Figure 7:
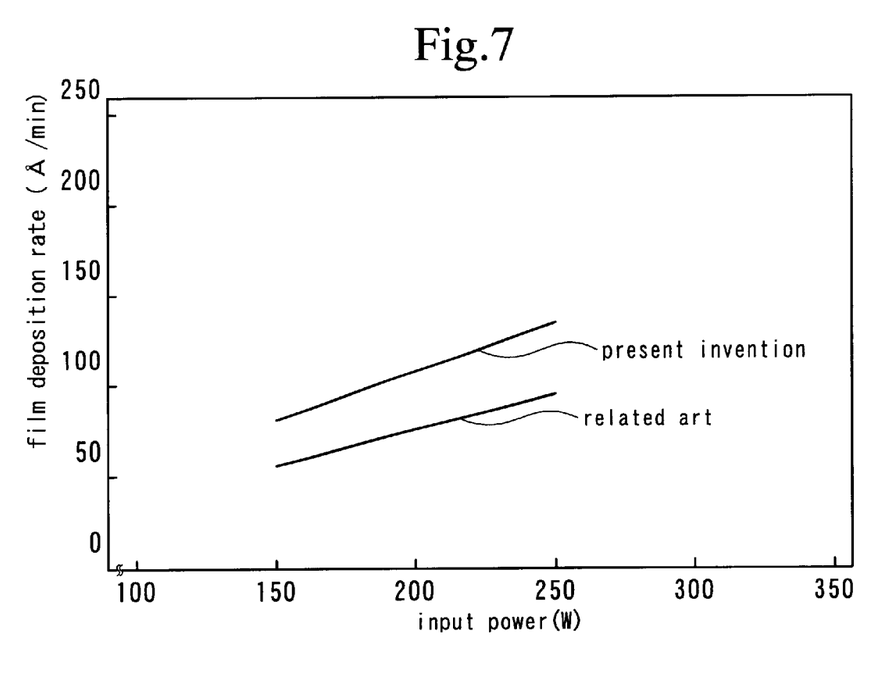
FIG. 7 is a graph showing film deposition rate directly below the target when the embodiment and a comparative example are used with the same input power and for the same film deposition duration.

As shown in FIG. 7, the device of this embodiment has a film deposition rate approximately 1.3 times greater than that of the device of the comparative example. This can be considered to be due to the fact that sputtering particles ejected from the target are efficiently attached to the substrate.

Films were deposited by a device of the embodiment and a device of the comparative example using the same input power and the same film deposition duration long. Target erosion of those devices is shown in FIG. 8(a) and FIG. 8(b).

Figure 8:
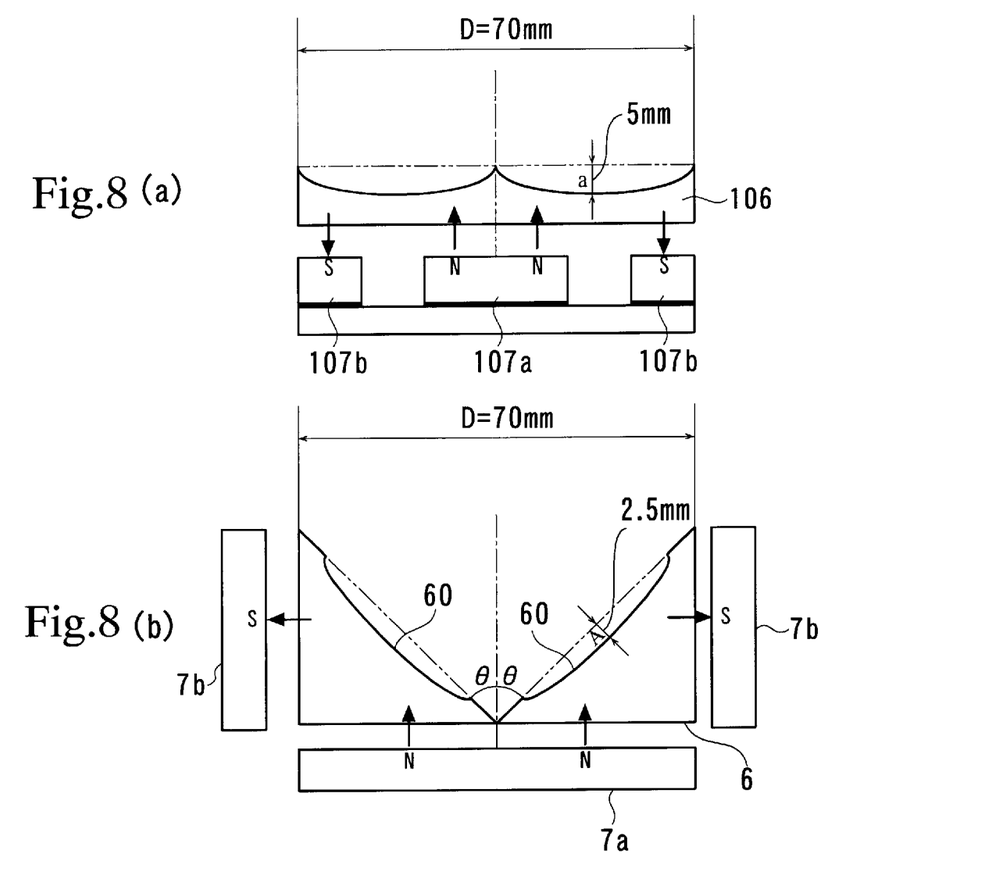
FIG. 8(a) is an explanatory drawing showing erosion of a device of a comparative example.
FIG. 8(b) is an explanatory drawing showing erosion of a device of the embodiment of the present invention.

FIG. 8(a) shows target of comparative example, and FIG. 8(b) shows target of embodiment of the present invention.

As shown in FIG. 8(a) and FIG. 8(b), compared to the case of the comparative example where the target 106 is eroded away to a =5 mm, the device of the embodiment is only eroded to A=2.5 mm and the amount of erosion of the target 6 is about half. This is due to the fact that the lifespan of the target is prolonged due to sputtering particles 20 ejected from the particle ejection surfaces 60 of the target 6 being redeposited to the target, as predicted from the above description.

Figure 9:
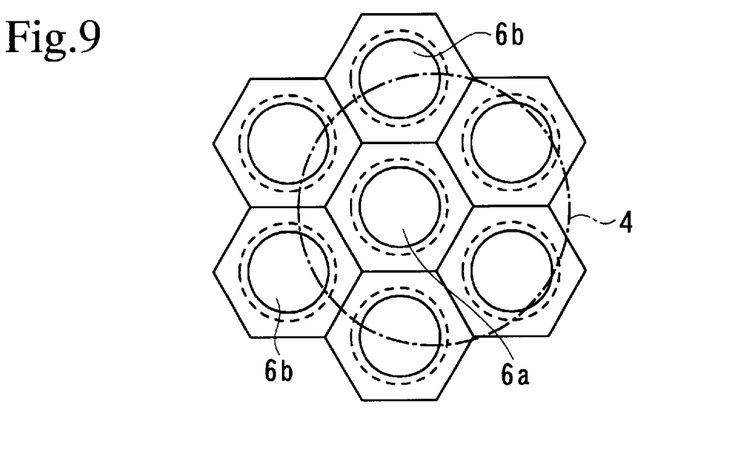
FIG. 9 is a plan view of essential parts of another embodiment of the present invention.
Figure 10:
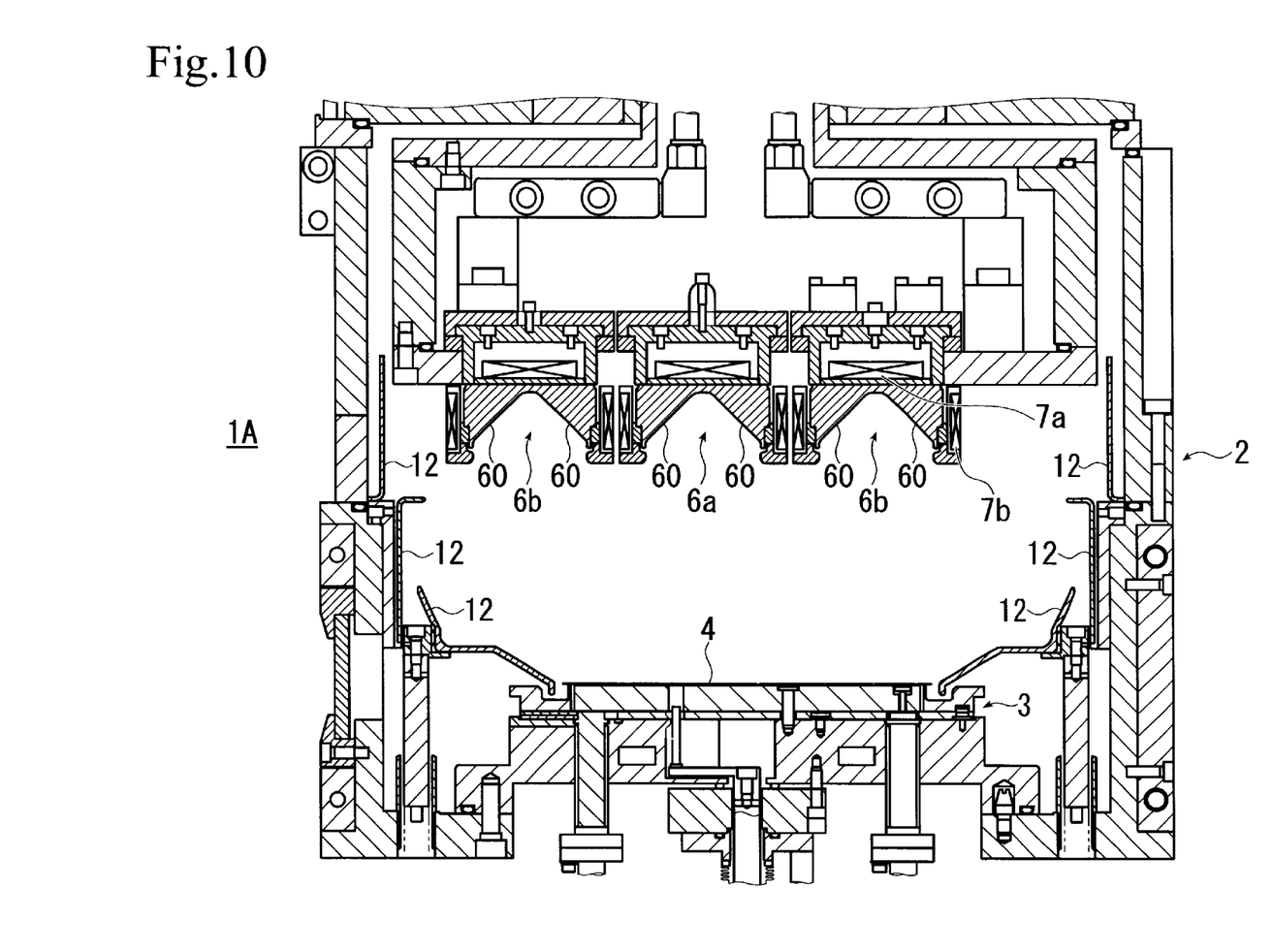
FIG. 10 is a cross sectional drawing showing the overall construction of this other embodiment of the present invention.
Figure 11:
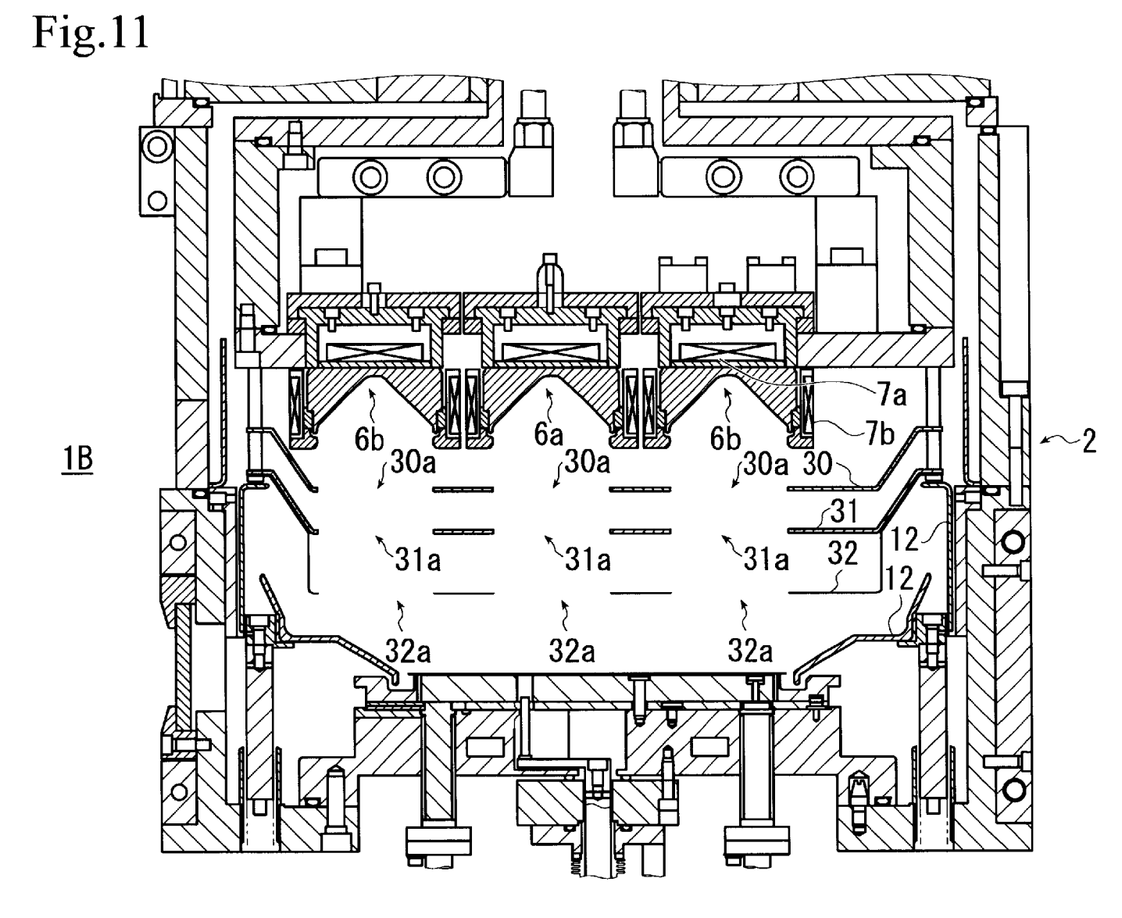
FIG. 11 is a cross sectional drawing showing the overall construction of yet another embodiment of the present invention.

FIG. 9 to FIG. 11 show other embodiments of the present invention, and are applied to a so-called multi-cathode type sputtering device. In the following, parts that are the same as those in the above described embodiment have the same reference numerals, and detailed description thereof will be omitted.

In the magnetron sputtering device 1A shown in FIG. 9 and FIG. 10, a plurality of (in this embodiment 7) targets 6 having the above described structure are arranged side by side inside a vacuum chamber 2.

As shown in FIG. 9, with this embodiment one target 6a is placed in the center and six targets 6b are arranged around that target at equal intervals.

The above mentioned magnets 7a and 7b are placed at locations around each of the targets 6 (6a, 6b) and at rear surfaces thereof It is possible to use each type of magnets as shown in FIG. 2(b) and FIG. 3 for magnets 7a and 7b of the present invention. Furthermore, it is possible to employ a structural arrangement for the present invention whereby the targets are mingled with each type of the magnets as shown in FIG. 2(b) and FIG. 3. Also, these targets (6a, 6b) are structured so that they can be rotated relative to the substrate 4. In this embodiment, in order to achieve uniform film thickness, as shown in FIG. 9, the center of rotation of the target 6 is varied with respect to the center of the substrate 4.

With this embodiment having the above described structure, in a multi-cathode type sputtering device 1A having small targets 6, the lifespan of each target 6 can be significantly prolonged . The remaining structure and operational effects of this embodiment are the same as for the above described embodiment, and a detailed description thereof will be omitted.

FIG. 11 shows a magnetron sputtering device of yet another embodiment, and in this magnetron sputtering device 1B, a plurality of (in this embodiment three) shield plates 30, 31 and 32 are arranged inside the vacuum chamber 2.

Each of the shield plates 30–32 are arranged parallel to the substrate 4 in between the substrate 4 and the targets 6, and circular holes 30*a*, 31*a* and 32*a* having diameters equal to the diameter of each target are provided at locations directly below each target 6.

With this embodiment having this type among structure, of the sputtering particles 20 ejected from the targets 6, only those flying out vertically or at an angle close to vertical can pass through the holes 30*a*–32*a* to reach the surface of the substrate 4. On the other hand, sputtering particles 20 that fly out diagonally are blocked by the shield plates 30–32 and deposit to the surfaces of the shield plates and so as not to be able to reach the substrate 4. As a result of this, only sputtering particles 20 having a small incident angle are incident, which means that it is possible to deposit thin film inside microscopic holes of high aspect ratio and microscopic grooves.

With this embodiment, sputtering particles 20 attached to the shield plates 30–32 do not drop down, which means that it is possible to prevent particulates, caused by sputtering particles 20, from becoming deposited to the inside of the vacuum chamber. The remaining structure and operational effects of this embodiment are the same as the above described embodiments, and a detailed description will be omitted.

According to the present invention, it is possible to efficiently guide sputtering particles ejected from a target to a substrate, and to prolong the lifespan of the target.

It is also possible to increase the interval at which stick preventive members need to be replaced by reducing the amount of sputtering particles depositing to the stick preventive members.

What is claimed is:

1. A magnetron sputtering device, for depositing a film on a surface of a substrate by sputtering using magnetron discharge, comprising:
   a vacuum chamber to be filled with a specified sputter gas;
   a cathode and an anode for generating electric discharge inside the vacuum chamber;
   a sputtering target arranged inside the vacuum chamber for facing the substrate, provided with particle ejection sections constructed so as to be sloped at specified angles with respect to the surface of the substrate and facing each other;
   a first magnet arranged at an entire rear surface side of the sputtering target; and
   a second magnet arranged around the sputtering target, the particle ejection sections taking the shape of a unitary inside portion of a funnel without a central through-hole,
   wherein shield plates having holes corresponding to the sputtering target are arranged between the sputtering target and the substrate.

2. The magnetron sputtering device according to claim 1, wherein slope angles θ of the sputtering particle ejection sections relative to a normal line of the substrate are between 30° and 60°.

3. The magnetron sputtering device according to claim 2, wherein lines of magnetic force run from an N pole of the first magnet to an S pole of the second magnet.

4. The magnetron sputtering device according to claim 2, wherein lines of magnetic force from an N pole of the second magnet to an S pole of the first magnet.

5. The magnetron sputtering device according to claim 1, wherein lines of magnetic force run from a N pole of the first magnet to an S pole of the second magnet.

6. The magnetron sputtering device according to claim 1, wherein lines of magnetic force run from a N pole of the second magnet to an S pole of the first magnet.

7. A magnetron sputtering device, for depositing a film on a surface of a substrate by sputtering using magnetron discharge, comprising:
   a vacuum chamber to be filled with a specified sputter gas;
   a cathode and an anode for generating electric discharge inside the vacuum chamber;
   a plurality of sputtering targets arranged side by side inside the vacuum chamber and being constructed so as to be rotatable relative to the substrate, arranged so as to face the substrate and being provided with particle ejection sections constructed so as to be sloped at specified angles with respect to the surface of the substrate and facing each other;
   a first magnet arranged at an entire rear surface side of the sputtering target; and
   a second magnet arranged around the sputtering target, the particle ejection sections taking the shape of a unitary inside portion of a funnel without a central through-hole,
   wherein shield plates having holes corresponding to the sputtering target are arranged between the sputtering target and the substrate.

8. The magnetron sputtering device according to claim 7, wherein slope angles θ of the sputtering particle ejection sections relative to a normal line of the substrate are between 30° and 60°.

9. The magnetron sputtering device according to claim 8, wherein lines of magnetic force run from an N pole of the first magnet to an S pole of the second magnet.

10. The magnetron sputtering device according to claim 8, wherein lines of magnetic force run from an N pole of the second magnet to an S pole of the first magnet.

11. The magnetron sputtering device according to claim 7, wherein lines of magnetic force run from a N pole of the first magnet to an S pole of the second magnet.

12. The magnetron sputtering device according to claim 7, wherein lines of magnetic force run from an N pole of the second magnet to an S pole of the first magnet.

13. A magnetron sputtering device, for depositing a film on a surface of a substrate by sputtering using magnetron discharge, comprising:
   a vacuum chamber to be filled with a specified sputter gas;
   a cathode and an anode for generating electric discharge inside the vacuum chamber;
   a sputtering target arranged inside the vacuum chamber for facing the substrate, provided with particle ejection sections constructed so as to be sloped at specified angles with respect to the surface of the substrate and facing each other, the particle ejection sections taking the shape of a unitary inside portion of a funnel without a central through-hole;
   a first magnet arranged at a rear surface side of the sputtering target, one of the N pole or the S pole facing and extending adjacent substantially the entire surface of the rear surface side of the sputtering target; and
   a second magnet arranged around an axial surface of the sputtering target, the other of the N pole or the S pole facing the axial surface of the sputtering target.

14. A magnetron sputtering device, for depositing a film on a surface of a substrate by sputtering using magnetron discharge, comprising:
   a vacuum chamber to be filled with a specified sputter gas;
   a cathode and an anode for generating electric discharge inside the vacuum chamber; and
   a plurality of sputtering targets arranged side by side inside the vacuum chamber and being constructed so as to be rotatable relative to the substrate, arranged so as to face the substrate and being provided with particle ejection sections constructed so as to be sloped at specified angles with respect to the surface of the substrate and facing each other, the particle ejection sections taking the shape of a unitary inside portion of a funnel without a central through-hole, wherein each sputtering target of said plurality of sputtering targets has a first magnet arranged at a rear surface side of the sputtering target, one of the N pole or the S pole facing and extending adjacent substantially the entire surface of the rear surface side of the sputtering target; and a second magnet arranged around an axial surface of the sputtering target, the other of the N pole or the S pole facing the axial surface of the sputtering target.

* * * * *